United States Patent
Lee

(10) Patent No.: US 9,576,680 B1
(45) Date of Patent: Feb. 21, 2017

(54) SEMICONDUCTOR DEVICES

(71) Applicant: SK hynix Inc., Icheon-si Gyeonggi-do (KR)

(72) Inventor: Joo Hyeon Lee, Bucheon-si (KR)

(73) Assignee: SK HYNIX INC., Icheon-si (KR)

(*) Notice: Subject to any disclaimer, the term of this patent is extended or adjusted under 35 U.S.C. 154(b) by 0 days.

(21) Appl. No.: 15/188,106

(22) Filed: Jun. 21, 2016

(30) Foreign Application Priority Data

Feb. 25, 2016 (KR) .......................... 10-2016-0022875

(51) Int. Cl.
G11C 7/00 (2006.01)
G11C 29/04 (2006.01)
G11C 7/10 (2006.01)
G11C 8/10 (2006.01)
G11C 17/16 (2006.01)
G11C 17/18 (2006.01)
G11C 29/00 (2006.01)

(52) U.S. Cl.
CPC ................. G11C 29/04 (2013.01); G11C 7/10 (2013.01); G11C 8/10 (2013.01); G11C 17/16 (2013.01); G11C 17/18 (2013.01); G11C 29/78 (2013.01)

(58) Field of Classification Search
CPC ............. G11C 29/04; G11C 7/10; G11C 8/10; G11C 17/16; G11C 17/18; G11C 29/78

USPC ......... 365/201, 96, 189.011, 189.17, 189.05, 365/189.12, 200, 208, 230.01, 230.03, 365/233.5, 244

See application file for complete search history.

(56) References Cited

U.S. PATENT DOCUMENTS

| 7,552,368 | B2 * | 6/2009 | Kim | ................... | G11C 29/1201 |
| | | | | | 714/718 |
| 2009/0080252 | A1 * | 3/2009 | Mitani | ................... | G11C 11/56 |
| | | | | | 365/185.03 |
| 2014/0078842 | A1 * | 3/2014 | Oh | ....................... | G11C 29/785 |
| | | | | | 365/200 |

FOREIGN PATENT DOCUMENTS

KR 1020140131207 A 11/2014

* cited by examiner

*Primary Examiner* — Fernando Hidalgo
(74) *Attorney, Agent, or Firm* — William Park & Associates Ltd.

(57) ABSTRACT

A semiconductor device may be provided. The semiconductor device may include a failure information generation circuit configured to generate first failure information. The semiconductor device may include a first latch data generation circuit configured to include the first failure information into first latch data of a first block and configured to output the first latch data including the first failure information. The semiconductor device may include a data synthesis circuit configured to generate first synthesis data.

20 Claims, 14 Drawing Sheets

SEMICONDUCTOR DEVICES

CROSS-REFERENCE TO RELATED APPLICATIONS

The present application claims priority under 35 U.S.C 119(a) to Korean Patent Application No. 10-2016-0022875, filed on Feb. 25, 2016, which is incorporated herein by reference in its entirety.

BACKGROUND

1. Technical Field

Embodiments of the present disclosure may generally relate to semiconductor devices, and more particularly, semiconductor devices relating to testing redundancy regions.

2. Related Art

As semiconductor devices become more highly integrated, a failure rate of memory cells of the semiconductor devices has been increased. This increase in failure rate is because of the increase of the number of the memory cells integrated in a limited area. As a result, the semiconductor devices are designed to include a redundancy circuit in order to increase a yield thereof even though defective memory cells exist after fabrication of the semiconductor devices.

The redundancy circuits include redundancy memory cells and fuses for programming repair addresses corresponding to failed memory cells. If fabrication processes of the semiconductor devices terminate at a wafer level, various tests may be applied to the semiconductor devices to sort repairable chips and to obtain addresses of failed memory cells or defective memory cells in the repairable chips. The addresses corresponding to the failed memory cells may be programmed to replace the failed memory cells of the repairable chips with the redundancy memory cells and to improve the yield of the semiconductor devices.

A fuse programming method may be used to program address information corresponding to the failed memory cells. In general, a laser blowing technique may be used in cutting the fuses. In such cases, the fuses may be physically cut using a laser beam. Accordingly, the laser blowing technique can be applied to the semiconductor devices only at a wafer level before the semiconductor devices are encapsulated to form semiconductor packages.

An electrical fuse bowing technique instead of the physical fuse bowing technique may be required to replace the failed memory cells with the redundancy memory cells at a package level. Fuses which can be programmed at a package level may be generally called electrical fuses. This means that predetermined fuses of the electrical fuses can be selectively cut using only an electrical signal. The electrical fuses may be categorized as either anti-type fuses or blowing-type fuses. The anti-type fuses may have an initial state of an open state and may have a short state after an electrical signal is applied thereto. In contrast, the blowing-type fuses may have an initial state of a short state and may have an open state after an electrical signal is applied thereto. Since the electrical fuse bowing technique can be used at a package level, the electrical fuse bowing technique may be very useful in the repair processes of the semiconductor devices.

SUMMARY

According to an embodiment, a semiconductor device may be provided. The semiconductor device may include a failure information generation circuit configured to generate first failure information including information on normality/abnormality of memory cells included in a first redundancy region. The semiconductor device may include a first latch data generation circuit configured to include the first failure information into first latch data of a first block corresponding to a logic level combination of a first address group and configured to output the first latch data including the first failure information. The semiconductor device may include a data synthesis circuit configured to generate first synthesis data from the first latch data outputted from the first latch data generation circuit. The semiconductor device may include a rupture disablement signal generation circuit configured to generate a rupture disablement signal blocking a rupture operation of the first block according to execution/non-execution of a repair operation of the first block based on the first synthesis data.

According to an embodiment, a semiconductor device may be provided. The semiconductor device may include a failure information generation circuit, a row latch data generation circuit, a column latch data generation circuit, and a rupture disablement signal generation circuit. The failure information generation circuit may be configured to generate row failure information and column failure information including information on normality/abnormality of memory cells included in a cross redundancy region, a row redundancy region and a cross redundancy region. The row latch data generation circuit may be configured to include the row failure information into row latch data of a row block corresponding to a logic level combination of a first address group and may be configured to output the row latch data including the row failure information. The column latch data generation circuit may be configured to include the column failure information into column latch data of a column block corresponding to a logic level combination of a second address group and may be configured to output the column latch data including the column failure information. The rupture disablement signal generation circuit may be configured to generate a rupture disablement signal blocking a rupture operation according to execution/non-execution of a repair operation of the row block or the column block based on row synthesis data generated from the row latch data and column synthesis data generated from the column latch data.

According to an embodiment, a semiconductor device may be provided. The semiconductor device may include a failure information generation circuit configured to generate row failure information and column failure information including information on a normality and abnormality of memory cells included in a column redundancy region and a row redundancy region. The semiconductor device may include a row latch data generation circuit configured to include the row failure information into row latch data of a row block corresponding to a logic level combination of a first address group and configured to output the row latch data including the row failure information. The semiconductor device may include a column latch data generation circuit configured to include the column failure information into column latch data of a column block corresponding to a logic level combination of a second address group and configured to output the column latch data including the column failure information. The semiconductor device may include a rupture signal generation circuit configured to generate an internal rupture signal, for performing a rupture operation, based on the row latch data of the row block corresponding to the logic level combination of the first address group and the column latch data of the column block corresponding to the logic level combination of the second address group, a rupture start signal, and a rupture end signal.

According to an embodiment, a semiconductor device may be provided. The semiconductor device may include a failure information generation circuit configured to generate first failure information including information on normality/abnormality of memory cells included in a first redundancy region. The semiconductor device may include a first latch data generation circuit configured to include the first failure information into first latch data of a first block corresponding to a logic level combination of a first address group and configured to output the first latch data including the first failure information. The semiconductor device may include a data synthesis circuit configured to generate first synthesis data from the first latch data outputted from the first latch data generation circuit. The semiconductor device may include a rupture signal generation circuit configured to generate an internal rupture signal, for performing a rupture operation, based on the first synthesis data from the first latch data outputted from the first latch data generation circuit, a rupture start signal, and a rupture end signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to a semiconductor device having a row redundancy function and or a column redundancy function.

Figure 1:
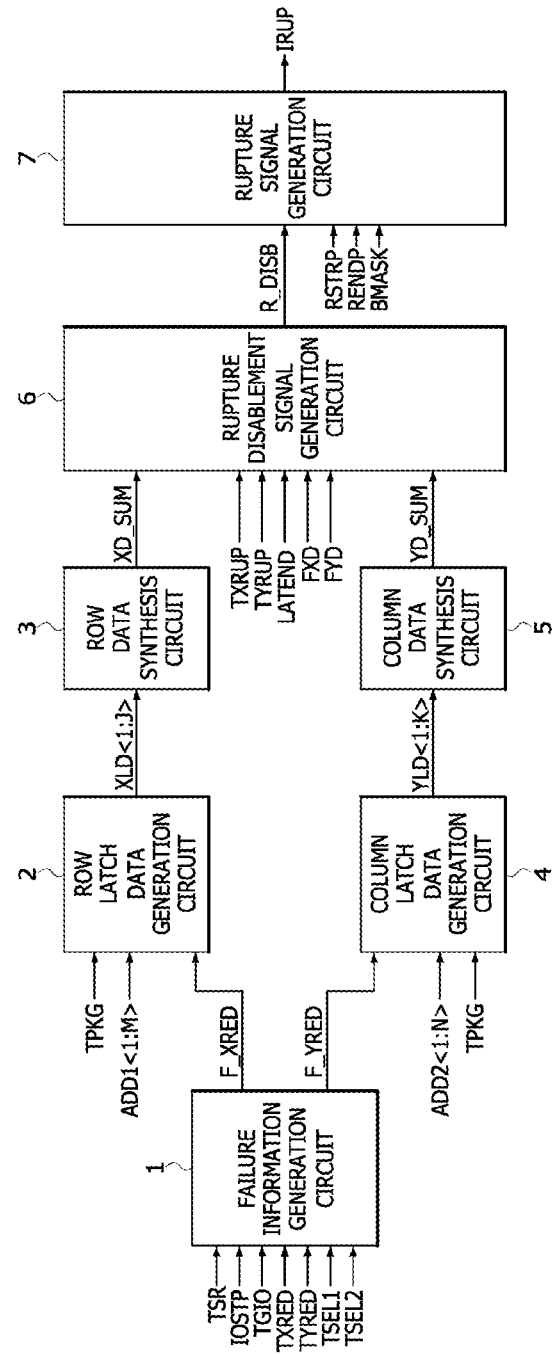
FIG. 1 is a block diagram illustrating a configuration of a semiconductor device according to an embodiment of the present disclosure.

Referring to FIG. 1, a semiconductor device according to the present disclosure may include a failure information generation circuit 1, a row latch data generation circuit 2, a row data synthesis circuit 3, a column latch data generation circuit 4, a column data synthesis circuit 5, a rupture disablement signal generation circuit 6, and a rupture signal generation circuit 7.

The failure information generation circuit 1 may generate a row failure information signal F_XRED and a column failure information signal F_YRED in response to a self-rupture test signal TSR, a read signal IOSTP, test data TGIO, a row redundancy test signal TXRED, a column redundancy test signal TYRED, a first selection test signal TSEL1, and a second selection test signal TSEL2. The self-rupture test signal TSR may be enabled for execution of a self-rupture test that discriminates between the normality and abnormality of memory cells through a parallel test to perform a rupture operation. The rupture operation may indicate an operation in which a failed memory cell is cut by applying a high voltage to replace the failed memory cell with a redundancy memory cell. The read signal IOSTP may include a pulse which is inputted during a read operation. The test data TGIO may be a signal having a level changed if existence of a failed memory cell is verified by the parallel test. The row redundancy test signal TXRED may be enabled to perform the self-rupture test of memory cells included in a row redundancy region (82 of FIG. 9). The column redundancy test signal TYRED may be enabled to perform the self-rupture test of memory cells included in a column redundancy region (83 of FIG. 9). The first selection test signal TSEL1 and the second selection test signal TSEL2 may be enabled to perform the self-rupture test of memory cells included in a cross redundancy region (84 of FIG. 9). The row failure information signal F_XRED may include information on a failed memory cell included in the row redundancy region. The column failure information signal F_YRED may include information on a failed memory cell included in the column redundancy region.

The failure information generation circuit 1 may generate the row failure information signal F_XRED having information on the normality/abnormality of memory cells included in the row redundancy region if the self-rupture test for the row redundancy region is performed. The failure information generation circuit 1 may generate the column failure information signal F_YRED having information on the normality/abnormality of memory cells included in the column redundancy region if the self-rupture test for the column redundancy region is performed. The failure information generation circuit 1 may generate at least one of the row failure information signal F_XRED and the column failure information signal F_YRED having information on the normality and abnormality (normality/abnormality) of memory cells included in the cross redundancy region if the self-rupture test for the cross redundancy region is performed.

The row latch data generation circuit 2 may generate row latch data XLD<1:3> from the row failure information signal F_XRED in response to a package test signal TPKG and a first address group ADD1<1:M>. The package test signal TPKG may be enabled in a test (hereinafter, referred to as "package test") which is performed at a package level. The first address group ADD1<1:M> may include at least one of a row address and a column address. The first address group ADD1<1:M> may have a logic level combination corresponding to any one of row blocks (901 to 904 and 911 to 914 of FIG. 9) included in at least one of the row redundancy region and the cross redundancy region. The row latch data generation circuit 2 may latch the row failure information signal F_XRED having information on the normality/abnormality of memory cells included in the row block corresponding to the logic level combination of the first address group ADD1<1:M> and may generate the row latch data XLD<1:J>, while the package test signal TPKG is enabled.

The row data synthesis circuit 3 may synthesize the row latch data XLD<1:3> to generate row synthesis data XD_SUM. The row data synthesis circuit 3 may generate the row synthesis data XD_SUM having a first level if bits included in the row latch data XLD<1:3> have the same logic level. The row data synthesis circuit 3 may generate the row synthesis data XD_SUM having a second level if at least one of the bits included in the row latch data XLD<1:3> has a different logic level from the other bits. The first level and the second level of the row synthesis data XD_SUM may be set to be opposite to each other according to the embodiments.

The column latch data generation circuit 4 may generate column latch data YLD<1:K> from the column failure information signal F_YRED in response to the package test signal TPKG and a second address group ADD2<1:N>. The second address group ADD2<1:N> may include at least one of a row address and a column address. The second address group ADD2<1:N> may have a logic level combination corresponding to any one of column blocks (925 to 928 of FIG. 10) included in at least one of the column redundancy region and the cross redundancy region. The column latch data generation circuit 4 may latch the column failure information signal F_YRED having information on the normality/abnormality of memory cells included in the column block corresponding to the logic level combination of the second address group ADD2<1:N> and may generate the column latch data YLD<1:K>, while the package test signal TPKG is enabled.

The column data synthesis circuit 5 may synthesize the column latch data YLD<1:K> to generate column synthesis data YD_SUM. The column data synthesis circuit 5 may generate the column synthesis data YD_SUM having a first level if bits included in the column latch data YLD<1:K> have the same logic level. The column data synthesis circuit 5 may generate the column synthesis data YD_SUM having a second level if at least one of the bits included in the column latch data YLD<1:K> has a different logic level from the other bits. The first level and the second level of the column synthesis data YD_SUM may be set to be opposite to each other according to the embodiments.

The rupture disablement signal generation circuit 6 may generate a rupture disablement signal R_DISB in response to a row rupture test signal TXRUP, a column rupture test signal TYRUP, a latch output signal LATEND, row repair data FXD, column repair data FYD, the row synthesis data XD_SUM, and the column synthesis data YD_SUM. The row rupture test signal TXRUP may be enabled for a rupture operation of the row redundancy region or the cross redundancy region. The column rupture test signal TYRUP may be enabled for a rupture operation of the column redundancy region or the cross redundancy region. The latch output signal LATEND may be enabled to output the row repair data FXD and the column repair data FYD which are inputted to latch circuits which are comprised of an array E-fuse (ARE) or the like. The row repair data FXD may include information on whether a repair operation of the row redundancy region is performed. The column repair data FYD may include information on whether a repair operation of the column redundancy region is performed. The rupture disablement signal R_DISB may be enabled to block the rupture operation. The rupture disablement signal generation circuit 6 may generate the rupture disablement signal R_DISB which is disabled if at least one of the memory cells included in any one of the row redundancy region, the cross redundancy region, and the cross redundancy region is a failed memory cell. The rupture disablement signal generation circuit 6 may generate the rupture disablement signal R_DISB which is enabled not to perform the rupture operation if a repair operation of any one of the row redundancy region, the cross redundancy region, and the cross redundancy region terminates.

The rupture signal generation circuit 7 may generate an internal rupture signal IRUP in response to the rupture disablement signal R_DISB, a rupture start signal RSTRP, a rupture end signal RENDP, and a mask signal BMASK. The rupture start signal RSTRP may include a pulse which is generated for the start of the rupture operation. The rupture end signal RENDP may include a pulse which is generated for the end of the rupture operation. The mask signal BMASK may be enabled if the rupture operation was performed in advance. The rupture signal generation circuit 7 may generate the internal rupture signal IRUP which is enabled to perform the rupture operation of any one of the row redundancy region, the cross redundancy region and the cross redundancy region during a time period from a point of time that the pulse of the rupture start signal RSTRP is inputted till a point of time that the pulse of the rupture end signal RENDP is inputted, while the rupture disablement signal R_DISB and the mask signal BMASK are disabled. The rupture signal generation circuit 7 may generate the internal rupture signal IRUP which is disabled to block the rupture operation if at least one of the rupture disablement signal R_DISB and the mask signal BMASK is enabled.

Figure 2:
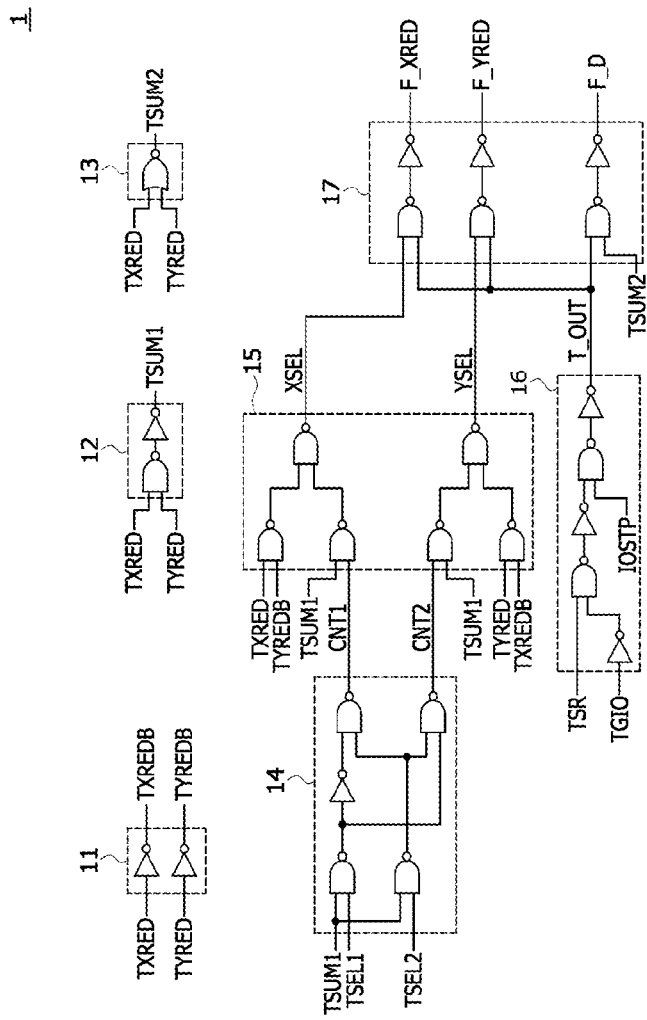
FIG. 2 is a circuit diagram of a failure information generation circuit included in the semiconductor device of FIG. 1.

Referring to FIG. 2, the failure information generation circuit 1 may include an inversion signal generation circuit 11, a first signal synthesis circuit 12, a second signal synthesis circuit 13, a control signal generation circuit 14, a selection signal generation circuit 15, a transmission data generation circuit 16, and a failure information selection output circuit 17.

The inversion signal generation circuit 11 may generate an inverted row redundancy test signal TXREDB and an inverted column redundancy test signal TYREDB from the row redundancy test signal TXRED and the column redundancy test signal TYRED, respectively. The inversion signal generation circuit 11 may inversely buffer the row redundancy test signal TXRED to generate the inverted row redundancy test signal TXREDB and may inversely buffer the column redundancy test signal TYRED to generate the inverted column redundancy test signal TYREDB.

The first signal synthesis circuit 12 may generate a first synthesis test signal TSUM1 in response to the row redundancy test signal TXRED and the column redundancy test signal TYRED. The first signal synthesis circuit 12 may generate the first synthesis test signal TSUM1 having a logic high level if both the row redundancy test signal TXRED and the column redundancy test signal TYRED are enabled to have a logic high level. The first signal synthesis circuit 12 may generate the first synthesis test signal TSUM1 having a logic low level if at least one of the row redundancy test signal TXRED and the column redundancy test signal TYRED is disabled to have a logic low level.

The second signal synthesis circuit 13 may generate a second synthesis test signal TSUM2 in response to the row redundancy test signal TXRED and the column redundancy test signal TYRED. The second signal synthesis circuit 13 may generate the second synthesis test signal TSUM2 having a logic low level if at least one of the row redundancy test signal TXRED and the column redundancy test signal TYRED is enabled to have a logic high level. The second signal synthesis circuit 13 may generate the second synthesis test signal TSUM2 having a logic high level if both the row redundancy test signal TXRED and the column redundancy test signal TYRED are disabled to have a logic low level.

The control signal generation circuit 14 may generate a first control signal CNT1 and a second control signal CNT2 from the first selection test signal TSEL1 and the second selection test signal TSEL2 respectively in response to the first synthesis test signal TSUM1. The control signal generation circuit 14 may generate the first control signal CNT1 having a logic high level and the second control signal CNT2 having logic low level, if both the first selection test signal TSEL1 and the second selection test signal TSEL2 have a logic low level while the first synthesis test signal TSUM1 has a logic high level. The control signal generation circuit 14 may generate the first control signal CNT1 having a logic low level and the second control signal CNT2 having a logic high level, if the first selection test signal TSEL1 has a logic high level and the second selection test signal TSEL2 has a logic low level while the first synthesis test signal TSUM1 has a logic high level. The control signal generation circuit 14 may generate the first control signal CNT1 having a logic high level and the second control signal CNT2 having a logic high level, if the first selection test signal TSEL1 has a logic low level and the second selection test signal TSEL2 has a logic high level while the first synthesis test signal TSUM1 has a logic high level.

The selection signal generation circuit 15 may generate a row selection signal XSEL and a column selection signal YSEL from the row redundancy test signal TXRED, the column redundancy test signal TYRED, the inverted row redundancy test signal TXREDB and the inverted column redundancy test signal TYREDB in response to the first synthesis test signal TSUM1. The selection signal generation circuit 15 may generate the row selection signal XSEL which is enabled to have a logic high level, if the row redundancy test signal TXRED is enabled to have a logic high level while the first synthesis test signal TSUM1 has a logic low level. The selection signal generation circuit 15 may generate the column selection signal YSEL which is enabled to have a logic high level, if the column redundancy test signal TYRED is enabled to have a logic high level while the first synthesis test signal TSUM1 has a logic low level. The selection signal generation circuit 15 may generate the row selection signal XSEL and the column selection signal YSEL from the first control signal CNT1 and the second control signal CNT2 in response to the first synthesis test signal TSUM1. The selection signal generation circuit 15 may generate the row selection signal XSEL which is enabled to have a logic high level by the first control signal CNT1 having a logic high level and may generate the column selection signal YSEL which is enabled to have a logic high level by the second control signal CNT2 having a logic high level, while the first synthesis test signal TSUM1 has a logic high level.

The transmission data generation circuit 16 may generate transmission data T_OUT from the test data TGIO in response to the self-rupture test signal TSR and the read signal IOSTP. The transmission data generation circuit 16 may inversely buffer the test data TGIO to output the inversely buffered data as the transmission data T_OUT, if a pulse of the read signal IOSTP is inputted according to a read operation while the self-rupture test signal TSR is enabled to perform the self-rupture test. The transmission data T_OUT may be generated to have a logic high level if there is a failed memory cell in a block which is tested and may be generated to have a logic low level if there is no failed memory cell in a block which is tested.

The failure information selection output circuit 17 may buffer the transmission data T_OUT to generate the row failure information signal F_XRED, the column failure information signal F_YRED and a failure information signal F_D in response to the row selection signal XSEL, the column selection signal YSEL and the second synthesis test signal TSUM2. The failure information signal F_D may include information on the normality/abnormality of memory cells included in a normal cell region (81 of FIG. 9) of the semiconductor device. Memory cells included in the normal cell region (81 of FIG. 9) may be evaluated by a read operation and a write operation. If at least one failed memory cell exists in the normal cell region (81 of FIG. 9), the failed memory cell may be replaced with a redundancy memory cell included in at least one of the row redundancy region, the cross redundancy region and the cross redundancy region to repair the semiconductor device. The failure information selection output circuit 17 may buffer the transmission data T_OUT to generate the row failure information signal F_XRED, if the row selection signal XSEL is enabled to have a logic high level. The failure information selection output circuit 17 may buffer the transmission data T_OUT to generate the column failure information signal F_YRED, if the column selection signal YSEL is enabled to have a logic high level. The failure information selection output circuit 17 may buffer the transmission data T_OUT to generate the failure information signal F_D, if the second synthesis test signal TSUM2 has a logic high level.

The failure information generation circuit 1 having an aforementioned configuration may buffer the transmission data T_OUT to generate the row failure information signal F_XRED if the self-rupture test of the row redundancy region is performed and may buffer the transmission data T_OUT to generate the column failure information signal F_YRED if the self-rupture test of the column redundancy region is performed. The failure information generation circuit 1 may buffer the transmission data T_OUT to generate at least one of the row failure information signal F_XRED and the column failure information signal F_YRED, if the self-rupture test of the cross redundancy region is performed. The failure information generation circuit 1 may buffer the transmission data T_OUT to generate the failure information signal F_D, if the self-rupture test of the memory cells included in the core region of the semiconductor device is performed.

Figure 3:
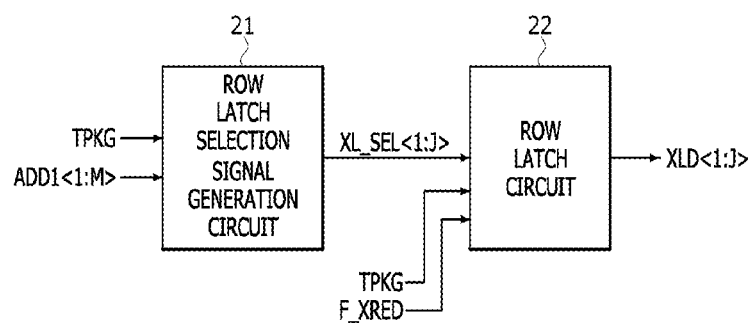
FIG. 3 is a block diagram illustrating a row latch data generation circuit included in the semiconductor device of FIG. 1.

Referring to FIG. 3, the row latch data generation circuit 2 may include a row latch selection signal generation circuit 21 and a row latch circuit 22.

The row latch selection signal generation circuit 21 may generate a row latch selection signal XL_SEL<1:3> from the first address group ADD1<1:M> in response to the package test signal TPKG. For example, the row latch selection signal generation circuit 21 may decode the first address group ADD1<1:M> to generate the row latch selection signal XL_SEL<1:J>, while the package test signal TPKG having a logic high level is inputted to perform a package test. The row latch selection signal XL_SEL<1:J> may have a logic level combination corresponding to any one of the row blocks.

The row latch circuit 22 may latch the row failure information signal F_XRED to generate the row latch data XLD<1:7> in response to the package test signal TPKG and the row latch selection signal XL_SEL<1:J>. For example, the row latch circuit 22 may latch the row failure information signal F_XRED to generate the row latch data XLD<1:J>, if the row latch selection signal XL_SEL<1:J> is enabled while the package test signal TPKG having a logic high level is inputted to perform the package test. Logic levels of the bits included in the row latch data XLD<1:3> may include information on the normality/abnormality of the row blocks.

Figure 4:
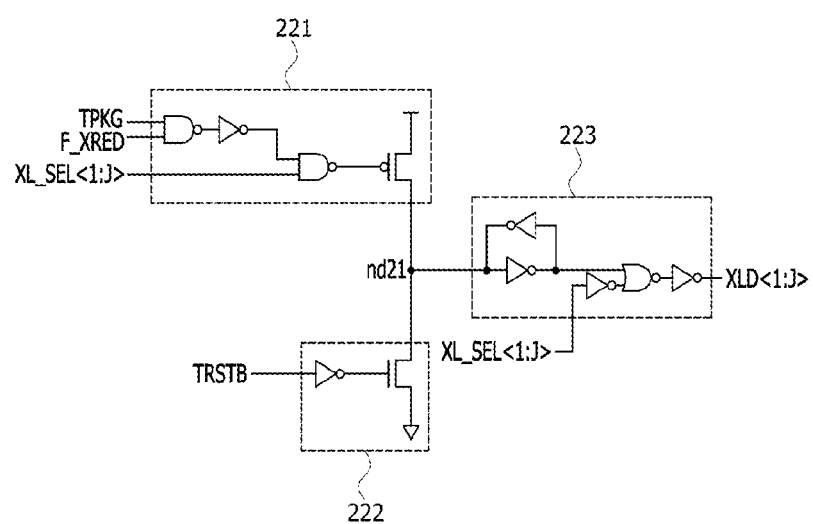
FIG. 4 is a circuit diagram of a row latch circuit included in the row latch data generation circuit of FIG. 3.

Referring to FIG. 4, the row latch circuit 22 may include a row pull-up drive circuit 221, a row pull-down drive circuit 222, and a row latch output circuit 223. The row pull-up drive circuit 221 may pull up a node nd21 to a logic high level in response to the package test signal TPKG, the row failure information signal F_XRED and the row latch selection signal XL_SEL<1:J>. The row pull-down drive circuit 222 may pull down the node nd21 to a logic low level in response to a test reset signal TRSTB. The row latch output circuit 223 may latch a signal of the node nd21 and may buffer the signal of the node nd21 to output the buffered signal as the row latch data XLD<1:J>, in response to the row latch selection signal XL_SEL<1:J>. The test reset signal TRSTB may be provided from an external device or may be generated in the semiconductor device to initialize a logic level combination of the row latch data XLD<1:J>.

The row latch circuit 22 may initialize the row latch data XLD<1:J> to a logic high level, if the test reset signal TRSTB having a logic low level is inputted. The row latch circuit 22 may generate the row latch data XLD<1:J> having a logic low level if the row latch selection signal XL_SEL<1:J> is enabled and the row failure information signal F_XRED having a logic high level is inputted because of at least one failed memory cell existing in a tested region, while the package test is performed.

Figure 5:
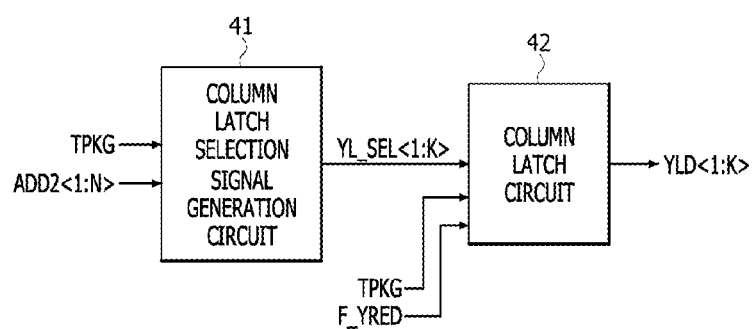
FIG. 5 is a block diagram illustrating a configuration of a column latch data generation circuit included in the semiconductor device of FIG. 1.

Referring to FIG. 5, the column latch data generation circuit 4 may include a column latch selection signal generation circuit 41 and a column latch circuit 42.

The column latch selection signal generation circuit 41 may generate a column latch selection signal YL_SEL<1:K> from the second address group ADD2<1:N> in response to the package test signal TPKG. For example, the column latch selection signal generation circuit 41 may decode the second address group ADD2<1:N> to generate the column latch selection signal YL_SEL<1:K> while the package test signal TPKG having a logic high level is inputted to perform a package test. The column latch selection signal YL_SEL<1:K> may have a logic level combination corresponding to any one of the column blocks.

The column latch circuit 42 may latch the column failure information signal F_YRED to generate the column latch data YLD<1:K> in response to the package test signal TPKG and the column latch selection signal YL_SEL<1:K>. For example, the column latch circuit 42 may latch the column failure information signal F_YRED to generate the column latch data YLD<1:K>, if the column latch data YLD<1:K> is enabled while the package test signal TPKG having a logic high level is inputted to perform the package test. Logic levels of the bits included in the column latch data YLD<1:K> may include information on the normality/abnormality of the row blocks.

Figure 6:
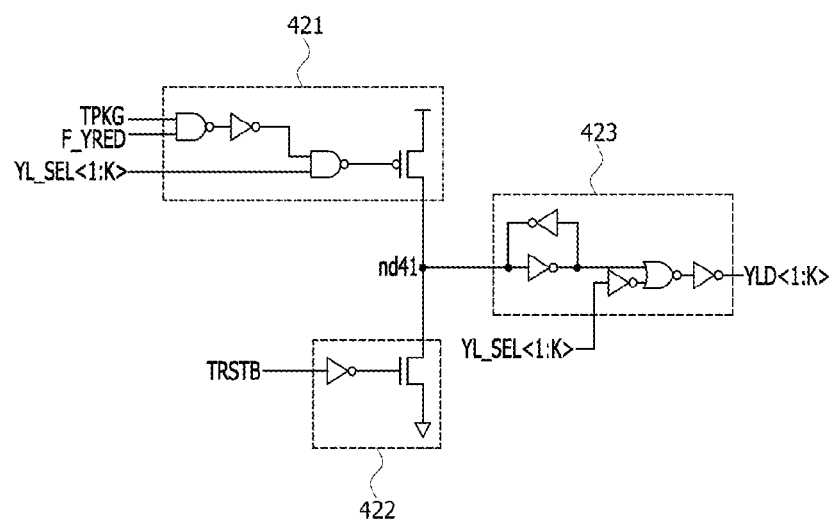
FIG. 6 is a circuit diagram of a column latch circuit included in the column latch data generation circuit of FIG. 5.

Referring to FIG. 6, the column latch circuit 42 may include a column pull-up drive circuit 421, a column pull-down drive circuit 422 and a column latch output circuit 423. The column pull-up drive circuit 421 may pull up a node nd41 to a logic high level in response to the package test signal TPKG, the column failure information signal F_YRED and the column latch selection signal YL_SEL<1:K>. The column pull-down drive circuit 422 may pull down the node nd41 to a logic low level in response to the test reset signal TRSTB. The column latch output circuit 423 may latch a signal of the node nd41 and may buffer the signal of the node nd41 to output the buffered signal as the column latch data YLD<1:K>, in response to the column latch selection signal YL_SEL<1:K>. The test reset signal TRSTB may be provided from an external device or may be generated in the semiconductor device to initialize a logic level combination of the column latch data YLD<1:K>.

The column latch circuit 42 may initialize the column latch data YLD<1:K> to a logic high level, if the test reset signal TRSTB having a logic low level is inputted. The column latch circuit 42 may generate the column latch data YLD<1:K> having a logic low level, if the column latch selection signal YL_SEL<1:K> is enabled and the column failure information signal F_YRED having a logic high level is inputted because of at least one failed memory cell existing in a tested region, while the package test is performed.

Figure 7:
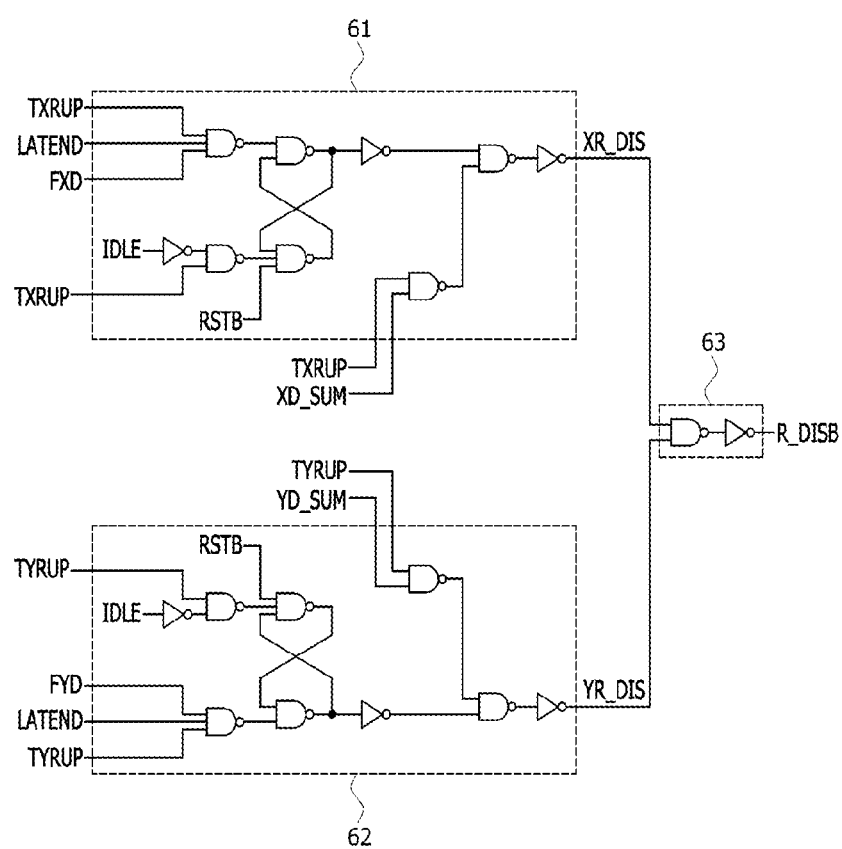
FIG. 7 is a circuit diagram of a rupture disablement signal generation circuit included in the semiconductor device of FIG. 1.

Referring to FIG. 7, the rupture disablement signal generation circuit 6 may include a row disablement signal generation circuit 61, a column disablement signal generation circuit 62, and a disablement signal synthesis circuit 63.

The row disablement signal generation circuit 61 may generate a row disablement signal XR_DIS in response to the row rupture test signal TXRUP, the latch output signal LATEND, the row repair data FXD, the row synthesis data XD_SUM, an idle signal IDLE, and a reset signal RSTB. The idle signal IDLE may be set to have a logic high level in an idle state, and the reset signal RSTB may be set to have a logic low level to initialize an internal node. The row disablement signal generation circuit 61 may generate the row disablement signal XR_DIS having a logic level which is set according to whether the row redundancy region or the cross redundancy region has at least one repaired memory cell while the row rupture test signal TXRUP having a logic high level is inputted to perform the rupture operation of the row redundancy region or the cross redundancy region. The row disablement signal generation circuit 61 may receive the latch output signal LATEND having a logic high level and the row repair data FXD having a logic high level to generate the row disablement signal XR_DIS having a logic low level, if the row redundancy region or the cross redundancy region has at least one repaired memory cell. The row disablement signal generation circuit 61 may generate the row disablement signal XR_DIS having a logic level which is set by the row synthesis data XD_SUM, if the row redundancy region and the cross redundancy region have no repaired memory cell. The row disablement signal generation circuit 61 may generate the row disablement signal XR_DIS having a logic low level which is set by the row synthesis data XD_SUM having a logic high level, if no failed memory cell is in the row redundancy region and the cross redundancy region. The row disablement signal generation circuit 61 may generate the row disablement signal XR_DIS having a logic high level which is set by the row synthesis data XD_SUM having a logic low level, if at least one failed memory cell exists in the row redundancy region or the cross redundancy region.

The column disablement signal generation circuit 62 may generate a column disablement signal YR_DIS in response to the column rupture test signal TYRUP, the latch output signal LATEND, the column repair data FYD, the column synthesis data YD_SUM, the idle signal IDLE, and the reset signal RSTB. The column disablement signal generation circuit 62 may generate the column disablement signal YR_DIS having a logic level which is set according to whether the column redundancy region or the cross redundancy region has at least one repaired memory cell while the column rupture test signal TYRUP having a logic high level is inputted to perform the rupture operation of the column redundancy region or the cross redundancy region. The column disablement signal generation circuit 62 may receive the latch output signal LATEND having a logic high level and the column repair data FYD having a logic high level to generate the column disablement signal YR_DIS having a logic low level, if the column redundancy region or the cross redundancy region has at least one repaired memory cell. The column disablement signal generation circuit 62 may generate the column disablement signal YR_DIS having a logic level which is set by the column synthesis data YD_SUM, if the row redundancy region and the cross redundancy region have no repaired memory cell. The column disablement signal generation circuit 62 may generate the column disablement signal YR_DIS having a logic low level which is set by the column synthesis data YD_SUM having a logic high level, if no failed memory cell is in the column redundancy region and the cross redundancy region. The column disablement signal generation circuit 62 may generate the column disablement signal YR_DIS having a logic high level which is set by the column synthesis data YD_SUM having a logic low level, if at least one failed memory cell exists in the column redundancy region or the cross redundancy region.

The disablement signal synthesis circuit 63 may generate the rupture disablement signal R_DISB in response to the row disablement signal XR_DIS and the column disablement signal YR_DIS. The disablement signal synthesis circuit 63 may generate the rupture disablement signal R_DISB which is enabled to have a logic low level, if at least one of the row disablement signal XR_DIS and the column disablement signal YR_DIS has a logic low level. The disablement signal synthesis circuit 63 may generate the rupture disablement signal R_DISB which is disabled to have a logic high level, if both the row blocking signal XR_DIS and the column disablement signal YR_DIS have a logic high level.

The rupture disablement signal generation circuit 6 having an aforementioned configuration may generate the rupture disablement signal R_DISB which is disabled to have a logic high level, if at least one failed memory cell exists in at least one of the row redundancy region, the cross redundancy region and the cross redundancy region. The rupture disablement signal generation circuit 6 may generate the rupture disablement signal R_DISB which is enabled to have a logic low level, if no failed memory cell exists in the row redundancy region, the cross redundancy region and the cross redundancy region or if the failed memory cell is repaired.

Figure 8:
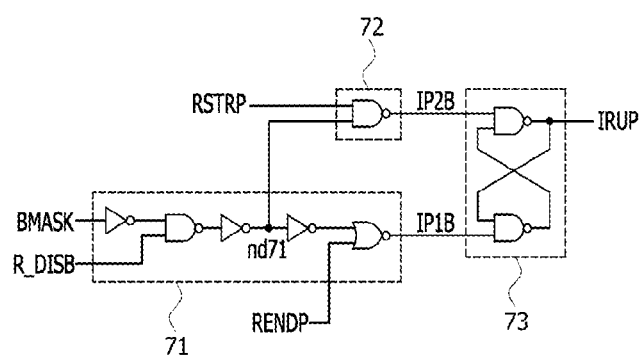
FIG. 8 is a circuit diagram of a rupture signal generation circuit included in the semiconductor device of FIG. 1.

Referring to FIG. 8, the rupture signal generation circuit 7 may include a first input pulse generation circuit 71, a second input pulse generation circuit 72, and a rupture signal output circuit 73. The first input pulse generation circuit 71 may generate a first input pulse IP1B in response to the mask signal BMASK, the rupture disablement signal R_DISB, and the rupture end signal RENDP. The first input pulse generation circuit 71 may generate the first input pulse IP1B having a logic low level, if the mask signal BMASK is enabled to have a logic high level. The first input pulse generation circuit 71 may generate the first input pulse IP1B having a logic low level, if the rupture disablement signal R_DISB is enabled to have a logic low level. The first input pulse generation circuit 71 may generate the first input pulse IP1B having a logic low level, if the rupture end signal RENDP having a logic high level is inputted. The second input pulse generation circuit 72 may generate a second input pulse IP2B in response to the rupture start signal RSTRP and a signal of a node nd71. The second input pulse generation circuit 72 may generate the second input pulse IP2B having a logic low level, if the rupture start signal RSTRP having a logic high level is inputted while the signal of the node nd71 has a logic high level. The rupture signal output circuit 73 may generate the internal rupture signal IRUP in response to the first input pulse IP1B and the second input pulse IP2B. The rupture signal output circuit 73 may generate the internal rupture signal IRUP which is enabled to have a logic high level if the first input pulse IP1B has a logic low level and may generate the internal rupture signal IRUP which is disabled to have a logic low level if the second input pulse IP2B has a logic low level.

Hereinafter, configurations of various examples of core regions will be described with reference to FIGS. 9 to 11.

Figure 9:
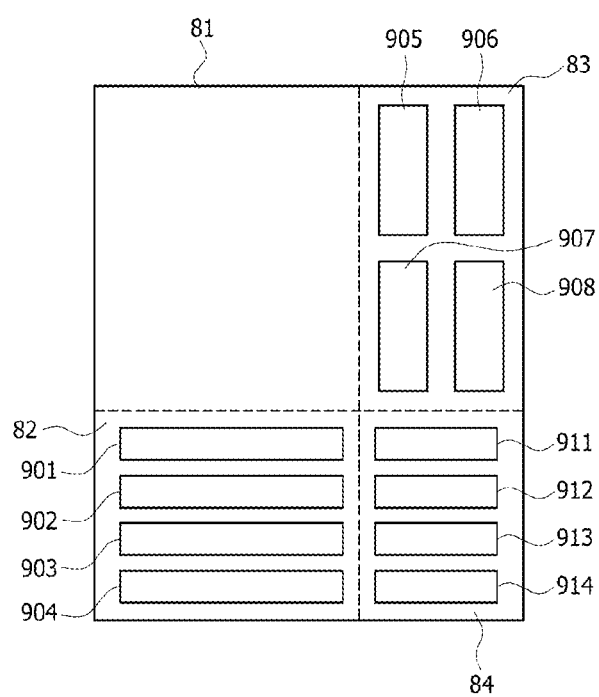
FIGS. 9 to 11 are layout diagrams illustrating various core regions employed in semiconductor devices according to some embodiments of the present disclosure.

Referring to FIG. 9, a core region 8a may include a normal cell region 81, a row redundancy region 82, a column redundancy region 83, and a cross redundancy region 84.

The row redundancy region 82 may include first to fourth row blocks 901 to 904. The normality/abnormality of memory cells included in any one of the first to fourth row blocks 901 to 904 may be included in any one of the row latch data XLD<1:3> according to a logic level combination of the first address group ADD1<1:M> while the row redundancy test signal TXRED is enabled. For example, information on the normality/abnormality of the memory cells included in the first row block 901 may be included in the row latch data XLD<1> according to a first logic level combination of the first address group ADD1<1:M>, and information on the normality/abnormality of the memory cells included in the second row block 902 may be included in the row latch data XLD<2> according to a second logic level combination of the first address group ADD1<1:M>.

The column redundancy region 83 may include first to fourth column blocks 905 to 908. The normality/abnormality of memory cells included in any one of the first to fourth column blocks 905 to 908 may be included in any one of the column latch data YLD<1:K> according to a logic level combination of the second address group ADD2<1:N> while the column redundancy test signal TYRED is enabled. For example, information on the normality/abnormality of the memory cells included in the first column block 905 may be included in the column latch data YLD<1> according to a first logic level combination of the second address group ADD2<1:N>, and information on the normality/abnormality of the memory cells included in the second column block 906 may be included in the column latch data YLD<2> according to a second logic level combination of the second address group ADD2<1:N>.

The cross redundancy region 84 may include fifth to eight row blocks 911 to 914. The normality/abnormality of memory cells included in any one of the fifth to eighth row blocks 911 to 914 may be included in any one of the row latch data XLD<1:3> according to a logic level combination of the first address group ADD1<1:M> while the row redundancy test signal TXRED and the column redundancy test signal TYRED are enabled and both the first selection test signal TSEL1 and the second selection test signal TSEL2 are set to have a logic low level. For example, information on the normality/abnormality of the memory cells included in the fifth row block 911 may be included in the row latch data XLD<1> according to a first logic level combination of the first address group ADD1<1:M>, and information on the normality/abnormality of the memory cells included in the sixth row block 912 may be included in the row latch data XLD<2> according to a second logic level combination of the first address group ADD1<1:M>.

Figure 10:
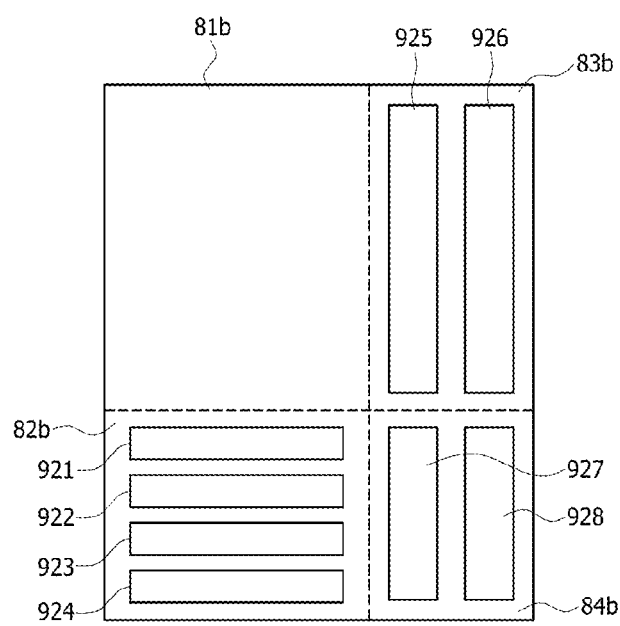

Referring to FIG. 10, a core region 8b may include, for example, a normal cell region 81b, a row redundancy region 82b, a column redundancy region 83b, and a cross redundancy region 84b.

The row redundancy region 82b may include first to fourth row blocks 921 to 924. The normality/abnormality of memory cells included in any one of the first to fourth row blocks 921 to 924 may be included in any one of the row latch data XLD<1:3> according to a logic level combination of the first address group ADD1<1:M> while the row redundancy test signal TXRED is enabled. For example, information on the normality/abnormality of the memory cells included in the first row block 921 may be included in the row latch data XLD<1> according to a first logic level combination of the first address group ADD1<1:M>, and information on the normality/abnormality of the memory cells included in the second row block 922 may be included in the row latch data XLD<2> according to a second logic level combination of the first address group ADD1<1:M>.

The column redundancy region 83b may include first and second column blocks 925 and 926. The normality/abnormality of memory cells included in any one of the first and second column blocks 925 and 926 may be included in any one of the column latch data YLD<1:K> according to a logic level combination of the second address group ADD2<1:N> while the column redundancy test signal TYRED is enabled. For example, information on the normality/abnormality of the memory cells included in the first column block 925 may be included in the column latch data YLD<1> according to a first logic level combination of the second address group ADD2<1:N>, and information on the normality/abnormality of the memory cells included in the second column block 926 may be included in the column latch data YLD<2> according to a second logic level combination of the second address group ADD2<1:N>.

The cross redundancy region 84b may include third and fourth column blocks 927 and 928. The normality/abnormality of memory cells included in any one of the third and fourth column blocks 927 to 928 may be included in any one of the column latch data YLD<1:K> according to a logic level combination of the second address group ADD2<1:N>, while the row redundancy test signal TXRED and the column redundancy test signal TYRED are enabled, the first selection test signal TSEL1 is set to have a logic high level, and the second selection test signal TSEL2 is set to have a logic low level. For example, information on the normality/abnormality of the memory cells included in the third column block 927 may be included in the column latch data YLD<1> according to a first logic level combination of the second address group ADD2<1:N>, and information on the normality/abnormality of the memory cells included in the fourth column block 928 may be included in the column latch data YLD<2> according to a second logic level combination of the second address group ADD2<1:N>.

Figure 11:
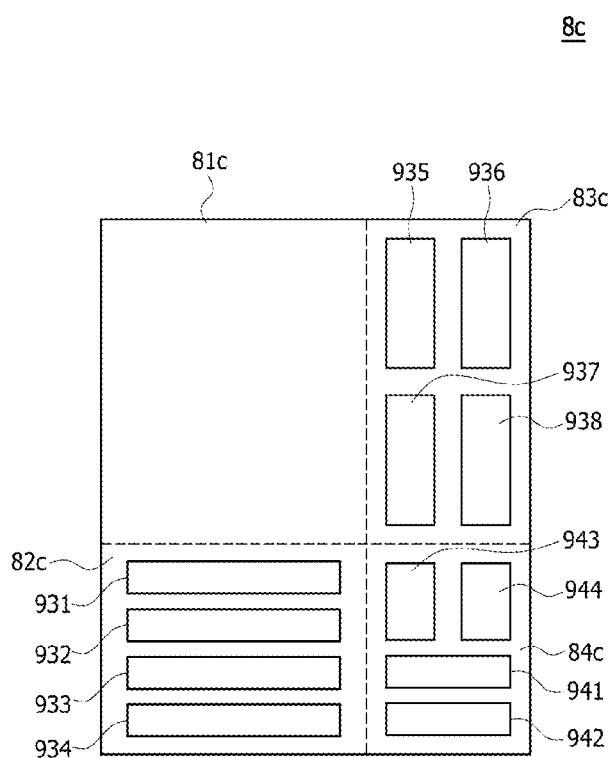

Referring to FIG. 11, a core region 8c may include a normal cell region 81c, a row redundancy region 82c, a column redundancy region 83c, and a cross redundancy region 84c.

The row redundancy region 82c may include first to fourth row blocks 931 to 934. The normality/abnormality of memory cells included in any one of the first to fourth row blocks 931 to 934 may be included in any one of the row latch data XLD<1:3> according to a logic level combination of the first address group ADD1<1:M> while the row redundancy test signal TXRED is enabled. For example, information on the normality/abnormality of the memory cells included in the first row block 931 may be included in the row latch data XLD<1> according to a first logic level combination of the first address group ADD1<1:M>, and information on the normality/abnormality of the memory cells included in the second row block 932 may be included in the row latch data XLD<2> according to a second logic level combination of the first address group ADD1<1:M>.

The column redundancy region 83c may include first to fourth column blocks 935 to 938. The normality/abnormality of memory cells included in any one of the first to fourth column blocks 935 to 938 may be included in any one of the column latch data YLD<1:K> according to a logic level combination of the second address group ADD2<1:N> while the column redundancy test signal TYRED is enabled. For example, information on the normality/abnormality of the memory cells included in the first column block 935 may be included in the column latch data YLD<1> according to a first logic level combination of the second address group ADD2<1:N>, and information on the normality/abnormality of the memory cells included in the second column block 936 may be included in the column latch data YLD<2> according to a second logic level combination of the second address group ADD2<1:N>.

The cross redundancy region 84c may include fifth and sixth row blocks 941 and 942 and fifth and sixth column blocks 943 and 944. The normality/abnormality of memory cells included in any one of the fifth and sixth row blocks 941 and 942 may be included in the row latch data XLD<1:3> according to a logic level combination of the first address group ADD1<1:M> while the row redundancy test signal TXRED and the column redundancy test signal TYRED are enabled, the first selection test signal TSEL1 is set to have a logic low level, and the second selection test signal TSEL2 is set to have a logic high level. For example, information on the normality/abnormality of the memory cells included in the fifth row block 941 may be included in the row latch data XLD<1> according to a first logic level combination of the first address group ADD1<1:M>, and information on the normality/abnormality of the memory cells included in the sixth row block 942 may be included in the row latch data XLD<2> according to a second logic level combination of the first address group ADD1<1:M>. The normality/abnormality of memory cells included in any one of the fifth and sixth column blocks 943 and 944 may be included in any one of the column latch data YLD<1:K> according to a logic level combination of the second address group ADD2<1:N>, while the row redundancy test signal TXRED and the column redundancy test signal TYRED are enabled, the first selection test signal TSEL1 is set to have a logic low level, and the second selection test signal TSEL2 is set to have a logic high level. For example, information on the normality/abnormality of the memory cells included in the fifth column block 943 may be included in the column latch data YLD<1> according to a first logic level combination of the second address group ADD2<1:N>, and information on the normality/abnormality of the memory cells included in the sixth column block 944 may be included in the column latch data YLD<2> according to a second logic level combination of the second address group ADD2<1:N>.

The rupture operation of the semiconductor device having an aforementioned configuration will be described with reference to FIGS. 12 and 13 in conjunction with an example in which the rupture operation of the memory cells included in the row redundancy region is performed and an example in which the rupture operation of the memory cells included in the column redundancy region is performed.

Figure 12:
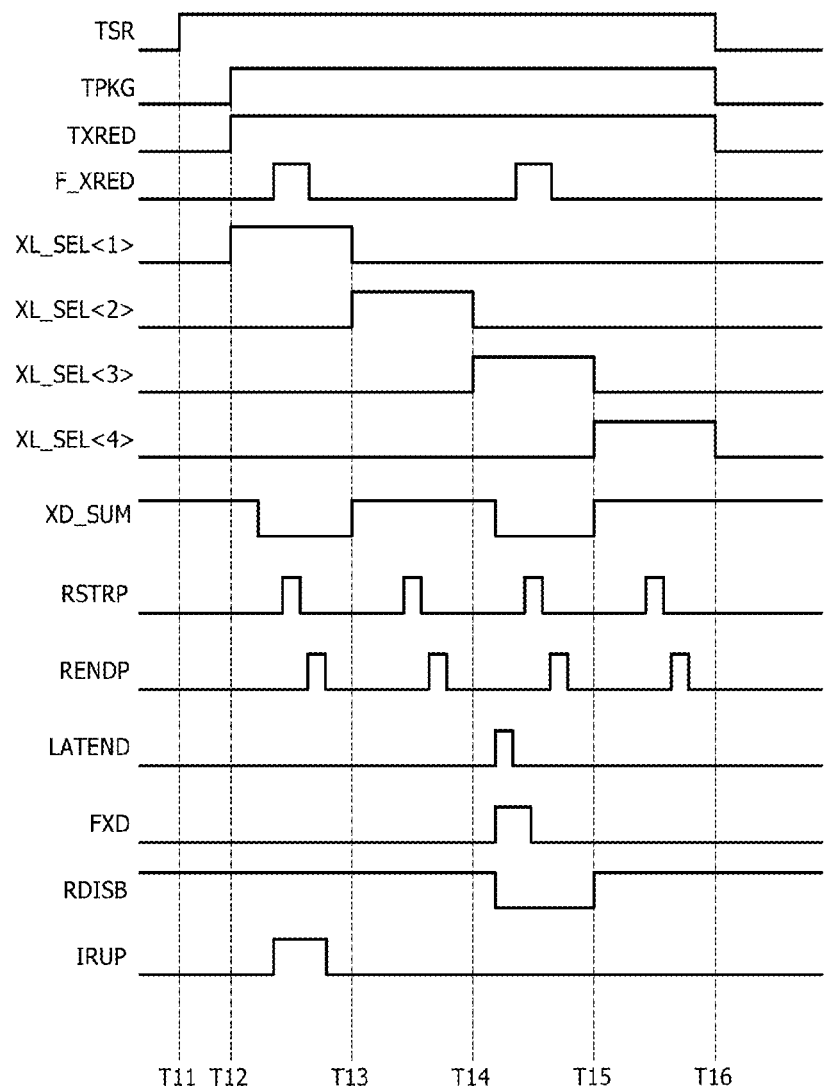
FIGS. 12 and 13 are timing diagrams illustrating an operation of the semiconductor device according to an embodiment of the present disclosure.

Referring to FIG. 12, if the self-rupture test of the row redundancy region is performed at a package level, the self-rupture test signal TSR may be changed from a logic low level to a logic high level at a point of time T11 and the package test signal TPKG and the row redundancy test signal TXRED are changed from a logic low level to a logic high level at a point of time T12. In a time period between the point of time T12 and a point of time T13, the first row latch selection signal XL_SEL<1> may be enabled to have a logic high level to evaluate the normality/abnormality of the memory cells included in the first row block corresponding to a first logic level combination of the first address group ADD1<1:M>. In a time period between the point of time T13 and a point of time T14, the second row latch selection signal XL_SEL<2> may be enabled to have a logic high level to evaluate the normality/abnormality of the memory cells included in the second row block corresponding to a second logic level combination of the first address group ADD1<1:M>. In a time period between the point of time T14 and a point of time T15, the third row latch selection signal XL_SEL<3> may be enabled to have a logic high level to evaluate the normality/abnormality of the memory cells included in the third row block corresponding to a third logic level combination of the first address group ADD1<1:M>. In a time period between the point of time T15 and a point of time T16, the fourth row latch selection signal XL_SEL<4> may be enabled to have a logic high level to evaluate the normality/abnormality of the memory cells included in the fourth row block corresponding to a fourth logic level combination of the first address group ADD1<1:M>. In the time period between the point of time T12 and the point of time T13, if the row synthesis data XD_SUM has a logic low level due to at least one failed memory cell existing in the first row block, the internal rupture signal IRUP may be enabled to have a logic high level for the rupture operation during a time period from a point of time that a pulse of the rupture start signal RSTRP is inputted till a point of time that a pulse of the rupture end signal RENDP is inputted. In the time period between the point of time T14 and the point of time T15, if the repair operation of the row redundancy region was performed in advance due to at least one failed memory cell existing in the third row block, the rupture disablement signal R_DISB may be enabled to have a logic low level by the latch output signal LATEND having a logic high level and the row repair data FXD having a logic high level and the internal rupture signal IRUP may be disabled to have a logic low level to disable the rupture operation while the row synthesis data XD_SUM has a logic low level.

Figure 13:
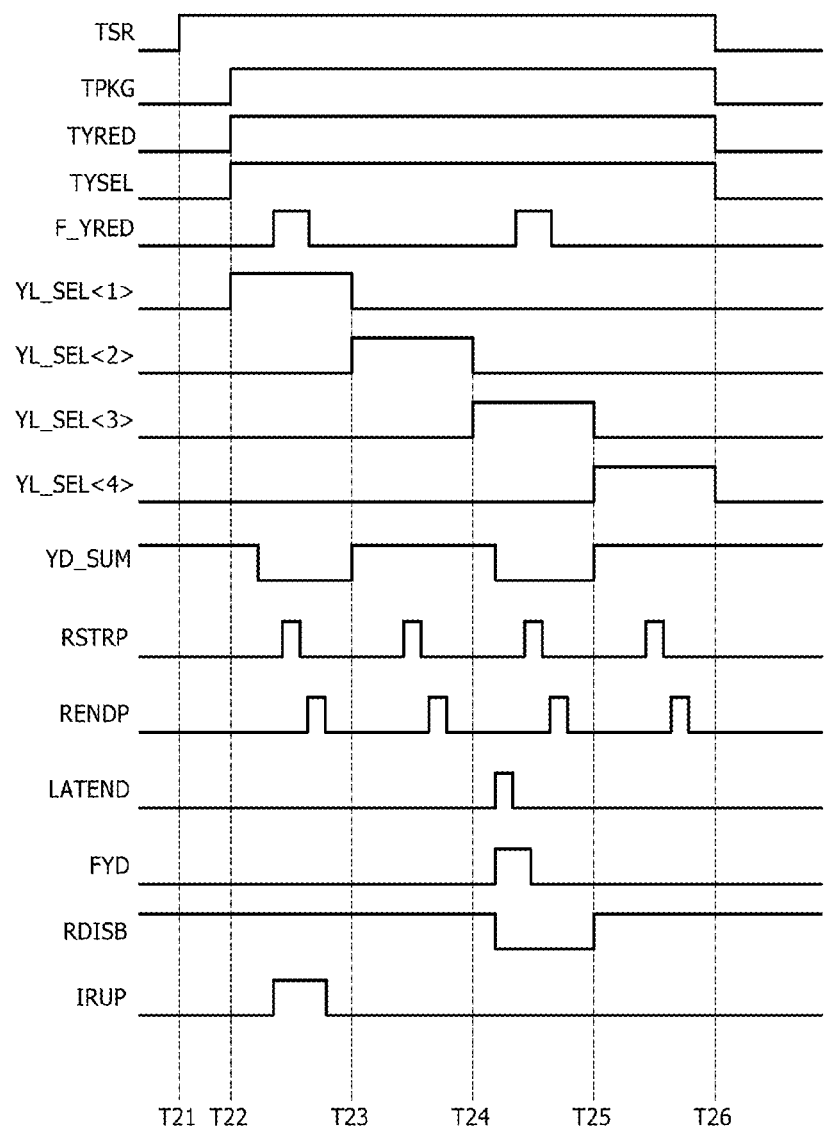

Referring to FIG. 13, if the self-rupture test of the column redundancy region is performed in a package state, the self-rupture test signal TSR may be changed from a logic low level to a logic high level at a point of time T21 and the package test signal TPKG and the column redundancy test signal TYRED may be changed from a logic low level to a logic high level at a point of time T22. In a time period between the point of time T22 and a point of time T23, the first column latch selection signal YL_SEL<1> may be enabled to have a logic high level to evaluate the normality/abnormality of the memory cells included in the first column block corresponding to a first logic level combination of the second address group ADD2<1:N>. In a time period between the point of time T23 and a point of time T24, the second column latch selection signal YL_SEL<2> may be enabled to have a logic high level to evaluate the normality/abnormality of the memory cells included in the second column block corresponding to a second logic level combination of the second address group ADD2<1:N>. In a time period between the point of time T24 and a point of time T25, the third column latch selection signal YL_SEL<3> may be enabled to have a logic high level to evaluate the normality/abnormality of the memory cells included in the third column block corresponding to a third logic level combination of the second address group ADD2<1:N>. In a time period between the point of time T25 and a point of time T26, the fourth column latch selection signal YL_SEL<4> may be enabled to have a logic high level to evaluate the normality/abnormality of the memory cells included in the fourth column block corresponding to a fourth logic level combination of the second address group ADD2<1:N>. In the time period between the point of time T22 and the point of time T23, if the column synthesis data YD_SUM has a logic low level due to at least one failed memory cell existing in the first column block, the internal rupture signal IRUP may be enabled to have a logic high level for the rupture operation during a time period from a point of time that the pulse of the rupture start signal RSTRP is inputted till a point of time that the pulse of the rupture end signal RENDP is inputted. In the time period between the point of time T24 and the point of time T25, if the repair operation of the column redundancy region was performed in advance due to at least one failed memory cell existing in the third column block, the rupture disablement signal R_DISB may be enabled to have a logic low level by the latch output signal LATEND having a logic high level and the column repair data FYD having a logic high level and the internal rupture signal IRUP may be disabled to have a logic low level to disable the rupture operation while the column synthesis data YD_SUM has a logic low level.

Figure 14:
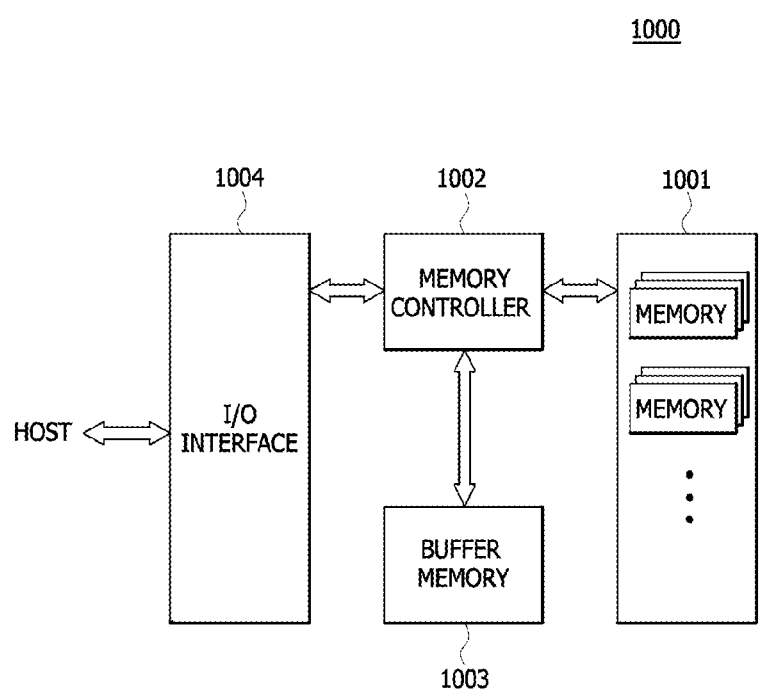
FIG. 14 is a block diagram illustrating a configuration of an electronic system employing the semiconductor device shown in FIG. 1.

The second semiconductor device described with reference to FIGS. 1 to 13 may be applied to an electronic system that may include a memory system, a graphic system, a computing system, a mobile system, or the like. For example, as illustrated in FIG. 14, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host HOST through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the present disclosure, a test may be performed to simultaneously evaluate the normality/abnormality of memory cells included in not only a row redundancy region but also a column redundancy region, and a rupture operation of the abnormal memory cells (i.e., failed memory cells) may be performed. Accordingly, a test time for the memory cells included in the redundancy regions may be reduced.

What is claimed is:

1. A semiconductor device comprising:
   a failure information generation circuit configured to generate first failure information including information on normality and abnormality (normality/abnormality) of memory cells included in a first redundancy region;
   a first latch data generation circuit configured to include the first failure information into first latch data of a first block corresponding to a logic level combination of a first address group and configured to output the first latch data including the first failure information;
   a data synthesis circuit configured to generate first synthesis data from the first latch data outputted from the first latch data generation circuit; and
   a rupture disablement signal generation circuit configured to generate a rupture disablement signal blocking a rupture operation of the first block according to an execution and non-execution (execution/non-execution) of a repair operation of the first block based on the first synthesis data.

2. The device of claim 1, wherein the first latch data generation circuit includes:
   a first latch selection signal generation circuit configured to decode the first address group to generate a first latch selection signal; and
   a first latch circuit configured to latch the first failure information based on the first latch selection signal to generate the first latch data.

3. The device of claim 2, wherein the first latch circuit includes:
   a first drive circuit configured to drive an internal node in response to the first latch selection signal and the first failure information; and
   a first latch output circuit configured to latch a signal of the internal node and configured to buffer the signal of the internal node to output the buffered signal as the first latch data based on the first latch selection signal.

4. The device of claim 1, wherein the rupture disablement signal generation circuit includes:
   a first disablement signal generation circuit configured to generate a first disablement signal according to a latch output signal, first repair data, and the first synthesis data; and
   a disablement signal synthesis circuit configured to generate the rupture disablement signal based on the first disablement signal.

5. The device of claim 4,
   wherein the first repair data includes information on the execution/non-execution of the repair operation of the first block; and
   wherein the first repair data is inputted to the first disablement signal generation circuit while the latch output signal is enabled.

6. The device of claim 1, further comprising a rupture signal generation circuit configured to generate an internal rupture signal in response to the rupture disablement signal, a rupture start signal, a rupture end signal, and a mask signal.

7. The device of claim 6,
   wherein the internal rupture signal is enabled for a rupture operation during a time period which is set by the rupture start signal and the rupture end signal; and
   wherein the internal rupture signal maintains a disabled state if the rupture disablement signal or the mask signal is enabled.

8. The device of claim 1,
   wherein the failure information generation circuit generates second failure information including information on normality/abnormality of memory cells included in a second redundancy region; and
   wherein the first redundancy region is a column redundancy region and the second redundancy region is a row redundancy region.

9. The device of claim 8, further comprising:
   a second latch data generation circuit configured to include the second failure information into second latch data of a second block corresponding to a logic level combination of a second address group and configured to output the second latch data including the second failure information; and
   a second data synthesis circuit configured to generate second synthesis data from the second latch data outputted from the second latch data generation circuit.

10. The device of claim 8, wherein the rupture disablement signal of the rupture disablement signal generation circuit is generated to disable a rupture operation of the second block, according to execution/non-execution of a repair operation of the second block based on the second synthesis data.

11. A semiconductor device comprising:
   a failure information generation circuit configured to generate row failure information and column failure information including information on a normality and abnormality of memory cells included in a column redundancy region, a row redundancy region, and a cross redundancy region;
   a row latch data generation circuit configured to include the row failure information into row latch data of a row block corresponding to a logic level combination of a first address group and configured to output the row latch data including the row failure information;
   a column latch data generation circuit configured to include the column failure information into column latch data of a column block corresponding to a logic level combination of a second address group and configured to output the column latch data including the column failure information; and
   a rupture disablement signal generation circuit configured to generate a rupture disablement signal blocking a rupture operation according to an execution and non-execution of a repair operation of the row block or the column block based on row synthesis data generated from the row latch data and column synthesis data generated from the column latch data.

12. The device of claim 11,
   wherein the failure information generation circuit is configured to generate the row failure information if a self-rupture test of the row redundancy region is performed, to generate column failure information if the self-rupture test of the column redundancy region is performed, and to generate at least one of the row failure information and the column failure information if the self-rupture test of the cross redundancy region is performed.

13. The device of claim 11, wherein the failure information generation circuit includes:
   a control signal generation circuit configured to generate a control signal from a first selection test signal and a second selection test signal based on a first synthesis test signal which is generated by synthesizing a row redundancy test signal and a column redundancy test signal;
   a selection signal generation circuit configured to generate a row selection signal and a column selection signal from the control signal, the row redundancy test signal and the column redundancy test signal based on the first synthesis test signal; and
   a failure information selection output circuit configured to buffer transmission data to generate the row failure information and the column failure information based on the row selection signal and the column selection signal.

14. The device of claim 11, wherein the cross redundancy region includes at least one of the row block and the column block.

15. The device of claim 11, wherein the row latch data generation circuit includes:
   a row latch selection signal generation circuit configured to decode the first address group to generate a row latch selection signal; and
   a row latch circuit configured to latch the row failure information based on the row latch selection signal to generate the row latch data.

16. The device of claim 11, wherein the column latch data generation circuit includes:
   a column latch selection signal generation circuit configured to decode the second address group to generate a column latch selection signal; and
   a column latch circuit configured to latch the column failure information based on the column latch selection signal to generate the column latch data.

17. The device of claim 11, wherein the rupture disablement signal generation circuit includes:
   a row disablement signal generation circuit configured to generate a row disablement signal according to a latch output signal, row repair data, and the row synthesis data;
   a column disablement signal generation circuit configured to generate a column disablement signal according to the latch output signal, column repair data, and the column synthesis data; and
   a disablement signal synthesis circuit configured to generate the rupture disablement signal based on the row disablement signal and the column disablement signal.

18. The device of claim 17,
   wherein the row repair data includes information on the execution/non-execution of the repair operation of the row block; and
   wherein the row repair data is inputted to the row disablement signal generation circuit while the latch output signal is enabled.

19. The device of claim 17,
   wherein the column repair data includes information on the execution/non-execution of the repair operation of the column block; and
   wherein the column repair data is inputted to the column disablement signal generation circuit while the latch output signal is enabled.

20. The device of claim 11, further comprising a rupture signal generation circuit configured to generate an internal rupture signal based on the rupture disablement signal, a rupture start signal, a rupture end signal, and a mask signal.

* * * * *